United States Patent
Karnad et al.

(10) Patent No.: US 8,384,395 B2
(45) Date of Patent: Feb. 26, 2013

(54) CIRCUIT FOR CONTROLLING TEMPERATURE AND ENABLING TESTING OF A SEMICONDUCTOR CHIP

(75) Inventors: Ravindra Karnad, Bangalore (IN); Sudheer Prasad, Bangalore (IN); Ram A Jonnavithula, Bangalore (IN)

(73) Assignee: Texas Instrument Incorporated, Dallas, TX (US)

( * ) Notice: Subject to any disclaimer, the term of this patent is extended or adjusted under 35 U.S.C. 154(b) by 343 days.

(21) Appl. No.: 12/774,730

(22) Filed: May 6, 2010

(65) Prior Publication Data

US 2011/0273186 A1    Nov. 10, 2011

(51) Int. Cl.
*H01H 31/02* (2006.01)
(52) U.S. Cl. ............... 324/555; 324/750.03; 324/750.05; 324/750.06; 714/733; 714/734; 374/E3.002; 374/E7.043
(58) Field of Classification Search ............. 324/750.05, 324/750.03, 750.06, 750.3, 555; 714/733, 714/734; 374/29, E3.002, E7.043
See application file for complete search history.

(56) References Cited

U.S. PATENT DOCUMENTS

| | | | | |
|---|---|---|---|---|
| 4,497,998 A | * | 2/1985 | West | 219/210 |
| 5,233,161 A | * | 8/1993 | Farwell et al. | 219/209 |
| 5,309,090 A | * | 5/1994 | Lipp | 324/750.03 |
| 5,543,632 A | * | 8/1996 | Ashley | 257/48 |
| 5,886,564 A | * | 3/1999 | Sato et al. | 327/513 |
| 6,590,405 B2 | * | 7/2003 | Okayasu | 324/750.03 |
| 7,183,784 B2 | * | 2/2007 | Maggi et al. | 324/750.05 |
| 7,696,768 B2 | * | 4/2010 | Greenberg et al. | 324/750.06 |
| 2008/0096490 A1 | * | 4/2008 | Okazaki et al. | 455/76 |
| 2008/0231306 A1 | * | 9/2008 | Maggi et al. | 324/763 |
| 2008/0309361 A1 | * | 12/2008 | Kita et al. | 324/760 |

FOREIGN PATENT DOCUMENTS

| | | |
|---|---|---|
| JP | 2009-103550 | 5/2009 |
| KR | 10-2007-0114310 | 11/2007 |
| WO | WO 2009-047805 | 4/2009 |

* cited by examiner

*Primary Examiner* — Huy Q Phan
*Assistant Examiner* — Thang Le
(74) *Attorney, Agent, or Firm* — Robert D. Marshall, Jr.; Wade James Brady, III; Frederick J. Telecky, Jr.

(57) ABSTRACT

A circuit for controlling temperature of a semiconductor chip includes a first heating element that is built into the semiconductor chip. The first heating element generates heat to increase the temperature of the semiconductor chip. The chip also includes a temperature controller that is coupled to the first heating element and built into the semiconductor chip. The temperature controller controls the temperature to enable testing of the semiconductor chip at a desired temperature.

11 Claims, 3 Drawing Sheets

CIRCUIT FOR CONTROLLING TEMPERATURE AND ENABLING TESTING OF A SEMICONDUCTOR CHIP

TECHNICAL FIELD

Embodiments of the disclosure relate to a circuit for controlling temperature and enabling testing of a semiconductor chip.

BACKGROUND

During manufacture of semiconductor chips, the semiconductor chips are subjected to reliability testing. A semiconductor chip that fails the reliability testing can be weeded out, thus preventing early failures during lifetime of the semiconductor chip.

Burn-in is an example of a reliability testing technique. During the burn-in, the semiconductor chips on a burn-in board are placed in an oven and exposed to temperatures higher than operating temperatures of the semiconductor chips. The semiconductor chips that fail to function in higher temperatures for a certain burn-in time can be detected as faulty. However, the oven is bulky and area inefficient. The oven is also expensive resulting in an increase in manufacturing cost of the semiconductor chip. High speed testing in the burn-in is further difficult to achieve due to limited clock rates resulting from high number of the semiconductor chips on the burn-in board. External sources are also required to heat the oven, the burn-in board, and the semiconductor chip which in turn leads to heating times longer than that required by the semiconductor chip in isolation, since the semiconductor chip has a lower thermal mass in isolation than that when the external sources are used. Moreover, time taken to heat up and to cool down the semiconductor chip during the burn-in is a sizeable fraction of total time for the burn-in. For example, the time required to heat up and to cool down the semiconductor chip is about 2 hours in a total time of 8 hours for the burn-in, making the burn-in time consuming.

SUMMARY

An example of a circuit for controlling temperature of a semiconductor chip includes a first heating element built into the semiconductor chip. The first heating element generates heat to increase the temperature of the semiconductor chip. The circuit also includes a temperature controller coupled to the first heating element and built into the semiconductor chip. The temperature controller controls the temperature to enable testing of the semiconductor chip at a desired temperature.

An example of a circuit for enabling testing of a semiconductor chip at a desired temperature includes a first heating element that is built into the semiconductor chip. The first heating element generates heat to increase temperature of the semiconductor chip. The circuit also includes a temperature sensor which is built into the semiconductor chip. The temperature sensor measures the temperature of the semiconductor chip to provide a voltage corresponding to the temperature. The circuit further includes a reference generator built into the semiconductor chip and responsive to an input temperature to provide a reference voltage. A comparator which is built into the semiconductor chip is coupled to the temperature sensor and the reference generator. The comparator compares the voltage corresponding to the temperature with the reference voltage to generate a comparator output. A first buffer is coupled between the comparator and the first heating element. The first buffer is responsive to the comparator output to perform one of activating the first heating element, and inactivating the first heating element. A first gate is further coupled between the comparator and the first buffer. The first gate and the first buffer inactivate the first heating element when the semiconductor chip is in a non-testing mode.

An example of a method includes heating a semiconductor chip using at least one heating element built into the semiconductor chip. The method also includes generating a voltage corresponding to a temperature of the semiconductor chip. The method further includes comparing the voltage with a reference voltage. Moreover, the method includes controlling the heating of the semiconductor chip by the at least one heating element based on output of the comparing to enable testing of the semiconductor chip at a desired temperature.

BRIEF DESCRIPTION OF THE VIEWS OF DRAWINGS

In the accompanying figures, similar reference numerals may refer to identical or functionally similar elements. These reference numerals are used in the detailed description to illustrate various embodiments and to explain various aspects and advantages of the present disclosure.

DETAILED DESCRIPTION OF THE EMBODIMENTS

Figure 1:
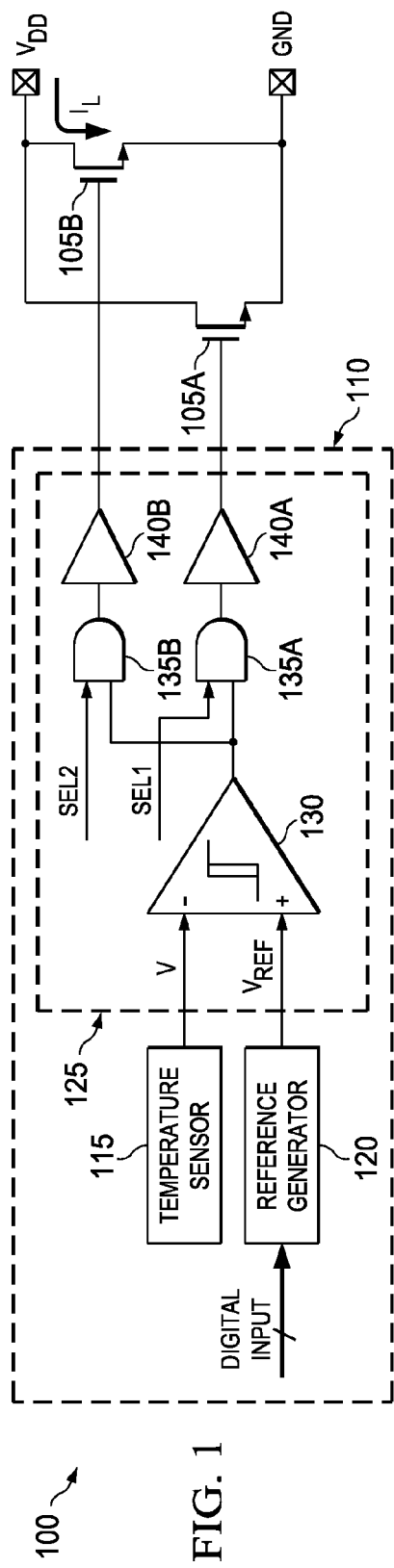
FIG. 1 illustrates a circuit for controlling temperature of a semiconductor chip, in accordance with one embodiment.

FIG. 1 illustrates a circuit 100 for controlling temperature of a semiconductor chip. The circuit 100 further enables testing of the semiconductor chip at a desired temperature by controlling the temperature. Test signals for performing testing of the semiconductor chip can be provided using a test circuit other than the circuit 100. The test circuit can be external to the semiconductor chip. The testing can be performed during manufacturing of the semiconductor chip. The circuit 100 can be used for performing burn-in testing. The circuit 100 can also be used during wafer probing and final production testing of packaged chips or devices. The circuit 100 can also be used during characterization of the semiconductor chip on automated testing equipment (ATE) or in laboratories. It is noted that the circuit 100 can also be used in various other application areas where it is desired to eliminate need of external heat sources for heating.

The desired temperature can be defined as a temperature of testing that is higher than ambient temperature or room temperature of the semiconductor chip.

The circuit 100 includes a first heating element 105A, hereinafter referred to as the heating element 105A, built into the semiconductor chip. The heating element 105A, for example a negative metal oxide semiconductor (NMOS) type transistor, has a drain coupled to a power supply (VDD) and a source coupled to a ground supply (GND).

In some embodiments, the heating element 105A can be a positive metal oxide semiconductor (PMOS) type transistor or a resistor. It is noted that the heating element 105A can also be a current source that is capable of generating heat.

It is noted that the heating element 105A can be sized differently for different semiconductor chips based on application areas of the semiconductor chips. Size of the heating element 105A can be based on desired leakage current, desired temperature, and desired amount of heat to be generated during testing of the semiconductor chip. During manufacturing of the semiconductor chip, the heating element 105A of appropriate size that is capable of generating the desired amount of heat is included in the semiconductor chip.

The circuit 100 also includes a temperature controller 110 coupled to a gate of the heating element 105A and built into the semiconductor chip. The temperature controller 110 includes a temperature sensor 115, a reference generator 120, and a control circuit 125. The temperature sensor 115 and the reference generator 120 are coupled to the control circuit 125.

The control circuit 125 includes a comparator 130, a first gate 135A, hereinafter referred to as the gate 135A, and a first buffer 140A, hereinafter referred to as the buffer 140A. A positive input terminal of the comparator 130 is coupled to the reference generator 120 and a negative input terminal of the comparator 130 is coupled to the temperature sensor 115. An output terminal of the comparator 130 is coupled to a first input terminal of the gate 135A. A second input terminal of the gate 135A receives a select input (SEL1). An output terminal of the gate 135A is coupled to an input terminal of the buffer 140A. An output terminal of the buffer 140A is coupled to the gate of the heating element 105A.

The working of the circuit 100 to control the temperature or junction temperature of the semiconductor chip is explained as follows. The heating element 105A generates heat to increase the temperature of the semiconductor chip. A leakage current ($I_L$) that flows through the heating element 105A can be an internal source of the heat. An increase in the temperature occurs due to total power of the semiconductor chip. The heat ($P_H$) required to increase the temperature (T) from ambient temperature ($T_A$) can be calculated from equation (1) as given below:

$$T = T_A + \theta_{JA}(P_A + P_H) \quad (1)$$

where $T_A$ is ambient temperature, $\theta_{JA}$ is thermal resistance from junction to a medium surrounding the semiconductor chip, and $P_A$ is active power dissipation of the semiconductor chip. The ambient temperature can be defined as temperature of the medium surrounding the semiconductor chip.

The temperature controller 110 controls the temperature to enable testing of the semiconductor chip at the desired temperature. The temperature controller 110 including various elements is further explained below.

The temperature sensor 115 of the temperature controller 110 measures the temperature of the semiconductor chip to provide a voltage (V) corresponding to the temperature. The temperature sensor 115 can be similar to a Proportional to Absolute Temperature (PTAT) sensor. The temperature sensor 115 including various elements is explained in conjunction with FIG. 2.

The reference generator 120 of the temperature controller 110 is responsive to a digital input, which can be provided by a user, to provide a reference voltage (VREF). In some embodiments, the reference voltage can be generated externally and provided to the control circuit 125. The reference generator 120 including various elements is explained in conjunction with FIG. 3.

The control circuit 125 of the temperature controller 110 inactivates the heating element 105A if the voltage corresponding to the temperature is greater than the reference voltage. The control circuit 125 including various elements is further explained now. The comparator 130 compares the voltage with the reference voltage to generate a comparator output. The buffer 140A is responsive to the comparator output to either activate the heating element 105A or inactivate the heating element 105A. The gate 135A and the buffer 140A together inactivate the heating element 105A when the semiconductor chip is in a non-testing mode.

In some embodiments, the comparator 130 prevents rapid switching of the heating element 105A by implementing hysteresis. Hysteresis can be used to delay a change in an output from one state to another. Example of the comparator 130 with hysteresis can include a Schmitt trigger. The comparator 130 with hysteresis either activates the heating element 105A when the temperature becomes less than a first threshold or inactivates the heating element 105A when the temperature exceeds a second threshold. The first threshold can be defined as a temperature corresponding to the voltage. The second threshold can be defined as a temperature corresponding to the reference voltage.

When the semiconductor chip is in the non-testing mode then the circuit 100 is desired to be inactive. The heating element 105A and in turn the circuit 100 can be inactivated based on the SEL1 irrespective of the comparator output. When the semiconductor chip is in a testing mode, the semiconductor chip is under test and can be referred to as a semiconductor device under test or as a semiconductor chip under test or as a device under test. In the testing mode, the heating element 105A and in turn the circuit 100 can be activated and inactivated based on the SEL1 and the comparator output. If SEL1=0, the circuit 100 is inactivated as the gate 135A neglects the comparator output and forces a zero into the heating element 105A thereby inactivating the circuit 100.

In some embodiments, when the heating element 105A is activated, voltage at the gate of the heating element 105A is equal to the power supply (VDD).

In some embodiments, the circuit 100 can include more than one heating element, for example a second heating element 105B in addition to the heating element 105A. The second heating element 105B is in parallel connection to the heating element 105A. The functioning of the second heating element 105B is similar to that of the heating element 105A. A second gate 135B can also be present to selectively activate or inactivate the second heating element 105B using a select input (SEL2). A second buffer 140B that is coupled to an output terminal of the second gate 135B is also responsive to the comparator output to either activate the heating element 105B or inactivate the second heating element 105B. The second gate 135B and the second buffer 140B together inactivate the second heating element 105B when the semiconductor chip is in the non-testing mode.

Several heating elements can be used based on various factors, for example total power dissipation needed. Further, the heating elements can be uniformly distributed and built into the semiconductor chip to enable uniform heating. An exemplary estimation is illustrated now. $P_A$ is determined to be 1 W, $\theta_{JA}$ is determined to be 20° C./W, and $T_A$ and $T_J$ is 20° C. and 140° C. respectively. Substituting values in equation (1), $P_H$ can be estimated to be 5 W. Four heating elements can be built into the semiconductor chip to dissipate 5 W uniformly across the semiconductor chip. Each heating element dissipates 1.25 W (5 W/4) to enable uniform heating of the semiconductor chip.

In some embodiments, the heating element 105A and the second heating element 105B are activated and inactivated simultaneously.

Figure 2:
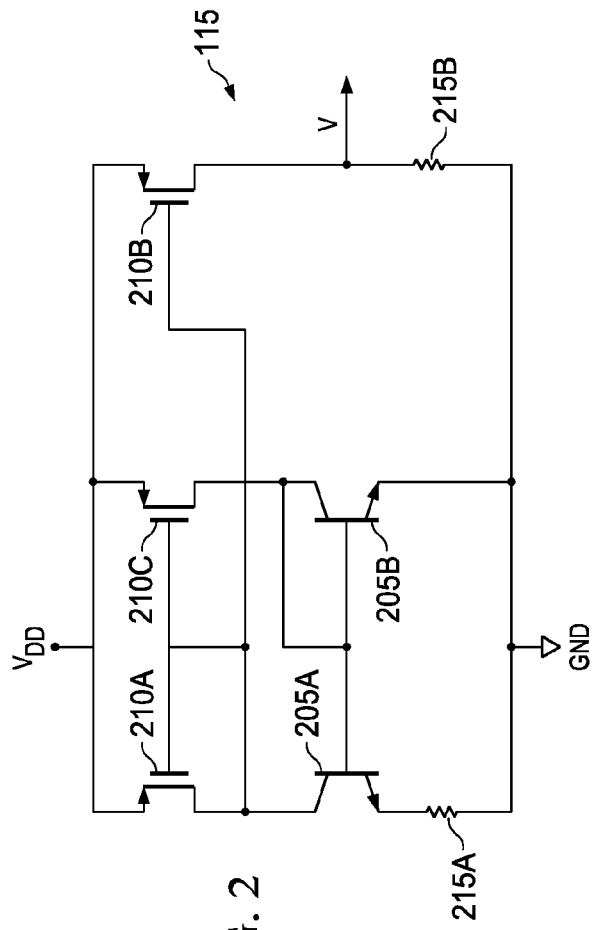
FIG. 2 illustrates a temperature sensor, in accordance with one embodiment.

Referring now to FIG. 2, the temperature sensor 115 includes a first transistor 205A, hereinafter referred to as the transistor 205A, a second transistor 205B, hereinafter referred to as the transistor 205B, a third transistor 210A, hereinafter referred to as the transistor 210A, a fourth transistor 210B, hereinafter referred to as the transistor 210B, a fifth transistor 210C, hereinafter referred to as the transistor 210C, a first resistor 215A, hereinafter referred to as the resistor 215A, and a second resistor 215B, hereinafter referred to as the resistor 215B. The transistor 205A is in a series connection with the transistor 210A and the resistor 215A. The transistor 205B is in a series connection with the transistor 210C. The transistor 210B is in a series connection with the resistor 215B. The transistor 205A has a base coupled to a base of the transistor 205B. The transistor 205A has a collector coupled to a drain of the transistor 210A and an emitter coupled to one terminal of the resistor 215A. The transistor 205B has a collector coupled to a drain of the transistor 210C and to the base of the transistor 205B, and an emitter coupled to a ground supply (GND). The transistor 210B has a drain coupled to one terminal of the resistor 215B. The transistor 210A has a gate coupled to a gate of the transistor 210C, to the drain of the transistor 210A, and to a gate of the transistor 210B. The transistor 210A, the transistor 210C, and the transistor 210B have sources coupled to a power supply (VDD). Other terminals of the resistor 215A and the resistor 215B are coupled to the ground supply (GND).

In some embodiments, the transistor 205A and the transistor 205B are similar negative type bipolar junction transistors with emitter area of the transistor 205A being N times that of the transistor 205B. In one example, N is 8 or 16.

In some embodiments, the transistor 210A, the transistor 210B, and the transistor 210C are positive metal oxide semiconductor (PMOS) type transistors similar to each other.

In some embodiments, the resistor 215A and the resistor 215B can be sized such that resistance of the resistor 215B is N times that of the resistor 215A. In one example, N is 5 or 10.

The temperature sensor 115 can be implemented in multiple ways. For example, the temperature sensor 115 can be a PTAT temperature sensor having an approximate sensitivity of 4 milli volts per degree celsius (mV/° C.). A current flowing from the power supply is divided into a first current and a second current by the transistor 210A and the transistor 210C. The current is proportional to absolute temperature of the semiconductor chip. The absolute temperature can be defined as temperature of the semiconductor chip measured relative to absolute zero. The difference in the base-emitter voltages (ΔVBE) of the transistor 205A and the transistor 205B can be represented using equation (2) below:

$$\Delta VBE = kT/q \times \ln(N) \quad (2)$$

where (kT/q) is thermal voltage and N is ratio of sizes of the transistor 205A and the transistor 205B. The thermal voltage can be defined as a voltage approximately equal to 26 mV at room temperature.

The working of the temperature sensor 115 to measure the temperature of the semiconductor chip is explained as follows. The transistor 205A is active and the first current flows through the transistor 210A, the transistor 205A, and the resistor 215A. The transistor 210A, the transistor 205A, and the resistor 215A together define a first path for the first current. The transistor 205B is active and the second current flows through the transistor 210C and the transistor 205B. The transistor 210C and the transistor 205B define a second path for the second current. The transistor 205A and the transistor 205b sense the temperature of the semiconductor chip. The transistor 210B and the resistor 215B together provide the voltage (V) corresponding to the temperature.

Figure 3:
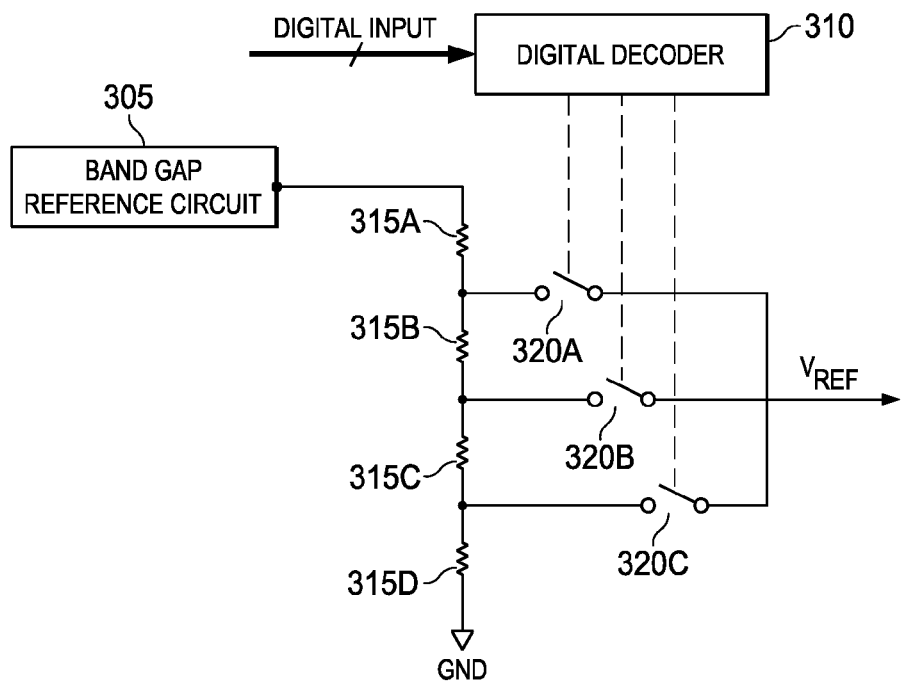
FIG. 3 illustrates a reference generator, in accordance with one embodiment.

FIG. 3 illustrates the reference generator 120. The reference generator 120 includes a band gap reference circuit 305, a plurality of resistors, a plurality of switches, and a digital decoder 310. The plurality of resistors is coupled between the band gap reference circuit 305 and the ground supply (GND). The plurality of resistors includes a resistor 315A, a resistor 315B, a resistor 315C, and a resistor 315D in series connection with each other. The plurality of switches includes a switch 320A, a switch 320B, and a switch 320C coupled between the plurality of resistors. The switch 320A is coupled between the resistor 315A and the resistor 315B, the switch 320B is coupled between the resistor 315B and the resistor 315C, and the switch 320C is coupled between the resistor 315C and the resistor 315D. The digital decoder 310 is coupled to the plurality of switches.

In some embodiments, the resistor 315A, the resistor 315B, the resistor 315C, and the resistor 315D can be similar in size and resistances.

In some embodiments, the switch 320A, the switch 320B, and the switch 320C are similar in size.

The band gap reference circuit 305 provides a predefined reference voltage. The band gap reference circuit 305 including various elements is explained in conjunction with FIG. 4. The predefined reference voltage can be further divided into one or more voltages by the resistors. The voltages can be provided at a plurality of nodes, for example a first node between the resistor 315A and the resistor 315B, a second node between the resistor 315B and the resistor 315C, and a third node between the resistor 315C and the resistor 315D. The digital decoder 310 is responsive to a digital input to select one of the switches. In one example, the digital input can have a size of 3 bits. A switch that is selected outputs a voltage associated with the switch as the reference voltage. For example, if the switch 320A is selected, voltage at the first node is provided as the reference voltage.

Figure 4:
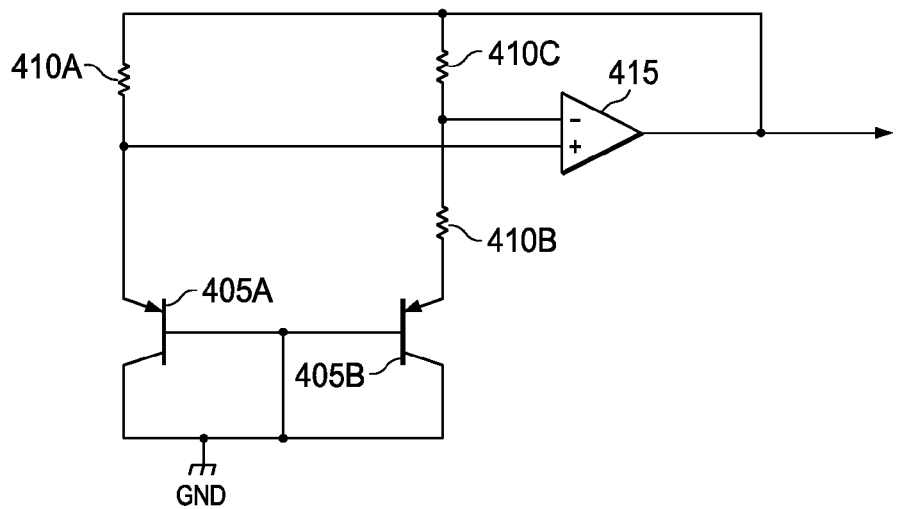
FIG. 4 illustrates a band gap reference circuit of a reference generator, in accordance with one embodiment.

Referring now to FIG. 4, the band gap reference circuit 305 includes a sixth transistor 405A, hereinafter referred to as the transistor 405A, a seventh transistor 405B, hereinafter referred to as the transistor 405B, a third resistor 410A, hereinafter referred to as the resistor 410A, a fourth resistor 410B, hereinafter referred to as the resistor 410B, a fifth resistor 410C, hereinafter referred to as the resistor 410C, and a feedback amplifier 415. The transistor 405A has a base coupled to a base of the transistor 405B and to the ground supply (GND), and an emitter coupled to one terminal of the resistor 410A. The transistor 405B has an emitter coupled to one terminal of the resistor 410B. The transistor 405A and the transistor 405B have collectors coupled to the ground supply (GND). The resistor 410C is coupled between other terminals of the resistor 410A and the resistor 410B. The feedback amplifier 415 has a positive input terminal coupled between the transistor 405A and the resistor 410A, a negative input terminal coupled between the resistor 410B and the resistor 410C, and an output terminal coupled to the other terminals of the resistor 410A and the resistor 410C.

In some embodiments, the transistor 405A and the transistor 405B are similar positive type bipolar junction transistors with emitter area of the transistor 405B being N times that of the transistor 405B. In one example, N is 8 or 16.

In some embodiments, the resistor 410A and the resistor 410B can be similar in size and resistances. The resistor 410C has a size N times that of the resistor 410A and the resistor 410B. In one example, N is 6.

The transistor 405A, in conjunction with the resistor 410A, generates a first reference voltage (VREF1) from a first base-emitter voltage (VBE1) of the transistor 405A. The first reference voltage has a negative temperature coefficient indicating that the first reference voltage decreases with an increase in the temperature. The transistor 405B, in conjunction with the resistor 410B and the resistor 410C, generates a second reference voltage (VREF2) from a second base-emitter voltage (VBE2) of the transistor 405B. The second reference voltage has a positive temperature coefficient indicating that the second reference voltage increases when the temperature decreases. The second reference voltage can be generated based on a difference in base-emitter voltages ($\Delta$VBE) of the transistor 405A and the transistor 405B. The second reference voltage can be scaled by a ratio of resistances of the resistor 410A and the resistor 410B or a ratio of resistances of the resistor 410C and the resistor 410B, to obtain the positive temperature coefficient. The first reference voltage is applied to the positive input terminal of the feedback amplifier 415 and the second reference voltage is applied to the negative input terminal of the feedback amplifier 415. The feedback amplifier 415 amplifies a difference between the first reference voltage and the second reference voltage to provide the predefined reference voltage. The predefined reference voltage is a voltage that does not vary with the temperature since a zero temperature coefficient is generated by adding the negative temperature coefficient and the positive temperature coefficient to the first reference voltage and the second reference voltage, respectively.

Figure 5:
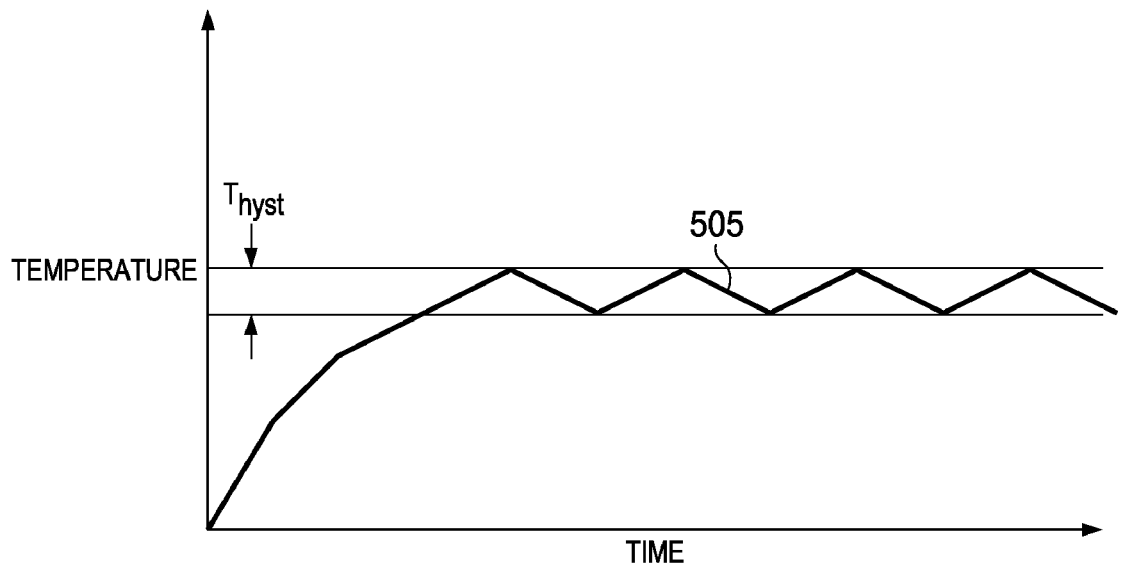
FIG. 5 is an exemplary representation illustrating hysteresis effect on temperature of a heating element, in accordance with one embodiment.

FIG. 5 is an exemplary representation illustrating hysteresis effect on the temperature of a heating element, for example the heating element 105A. X axis represents variation in time and Y axis represents variation in the temperature of the heating element 105A. A waveform 505 corresponds to the variation in the temperature of the heating element 105A with respect to the variation in the time due to hysteresis implemented in the comparator, for example the comparator 130. The hysteresis prevents rapid switching of the heating element 105A. The waveform 505 indicates that the hysteresis prevents the temperature of the heating element 105A from invariably increasing and keeps the temperature within a range as illustrated by $T_{hyst}$.

Figure 6:
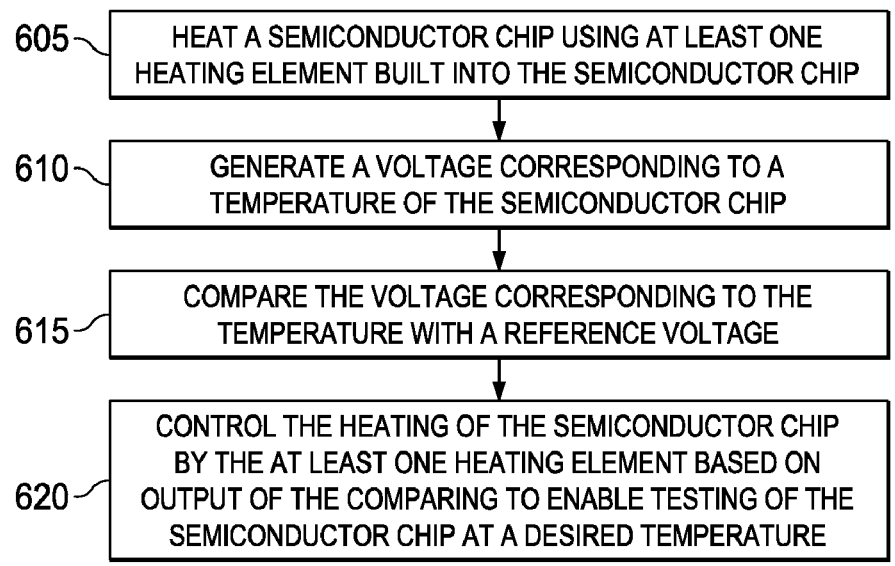
FIG. 6 is a flow diagram illustrating a method for controlling temperature of a semiconductor chip, in accordance with one embodiment.

FIG. 6 is a flow diagram illustrating a method for controlling temperature of a semiconductor chip. The method enables testing of the semiconductor chip at the desired temperature.

At step 605, the semiconductor chip is heated using at least one heating element, for example a heating element 105A, built into the semiconductor chip. In some embodiments, another heating element, for example a heating element 105B, can also be used in conjunction with the heating element 105A to heat the semiconductor chip. The semiconductor chip is thereby heated internally to increase the temperature of the semiconductor chip.

At step 610, a voltage corresponding to the temperature of the semiconductor chip is generated. A temperature sensor, for example the temperature sensor 115, can be used to measure the temperature of the semiconductor chip and to generate the voltage corresponding to the temperature.

At step 615, the voltage corresponding to the temperature is compared with a reference voltage. A reference generator, for example the reference generator 120, can be used to provide the reference voltage based on a digital input. A control circuit, for example the control circuit 125, can be used to compare the voltage with the reference voltage.

In some embodiments, comparison of the voltage causes activation of the at least one heating element when the temperature becomes less than a first threshold or inactivation of the at least one heating element when the temperature exceeds a second threshold. Such an effect is due to hysteresis which prevents rapid switching of the at least one heating element between an active mode and an inactive mode.

At step 620, heating of the semiconductor chip is controlled by the at least one heating element based on output of comparing to enable testing of the semiconductor chip at the desired temperature. In a testing mode, the at least one heating element is activated, for example by using the control circuit, if the voltage is lesser than the reference voltage. If there are many heating elements, each heating element can be selectively activated. A heating element that is activated can be referred to as an activated heating element. The activated heating element is inactivated, for example by using the control circuit, if the voltage corresponding to the temperature is greater than the reference voltage. If there are many activated heating elements then each activated heating element can be inactivated. The heating and in turn the temperature of the semiconductor chip can be controlled as desired. Further, the semiconductor chip can be thus tested at the desired temperature.

In some embodiments, the at least one heating element is inactivated when the semiconductor chip is in a non-testing mode.

By controlling the temperature of the semiconductor chip, testing of the semiconductor chip at the desired temperature can be enabled. Since the heating is performed internally, duration of the testing and production cost can also be reduced. The method can further be used to maintain multiple semiconductor chips at the desired temperature as the temperature of each semiconductor chip is individually controlled.

In the foregoing discussion, the term "coupled" refers to either a direct electrical connection between the devices connected or an indirect connection through one or more passive or active intermediary devices. The term "circuit" means at least either a single component or a multiplicity of components, that are connected together to provide a desired function. The term "signal" means at least one current, voltage, charge, data, or other signal.

The foregoing description sets forth numerous specific details to convey a thorough understanding of embodiments of the disclosure. However, it will be apparent to one skilled in the art that embodiments of the disclosure may be practiced without these specific details. Some well-known features are not described in detail in order to avoid obscuring the disclosure. Other variations and embodiments are possible in light of above teachings, and it is thus intended that the scope of disclosure not be limited by this Detailed Description, but only by the Claims.

What is claimed is:

1. A circuit for controlling temperature of a semiconductor chip, the circuit comprising:
    a first heating element, built into the semiconductor chip, that generates heat to increase the temperature of the semiconductor chip; and
    a temperature controller, having a temperature sensor, coupled to the first heating element and built into the semiconductor chip, that controls the temperature to enable testing of the semiconductor chip at a desired temperature, wherein the temperature sensor comprises:
    a first transistor that senses the temperature;

a second transistor, having a base connected to a base of the first transistor, that senses the temperature in conjunction with the first transistor;

a third transistor coupled to a power supply and having a drain coupled to a collector of the first transistor;

a fourth transistor coupled to the power supply and having a gate coupled to a gate of the third transistor;

a first resistor in series connection with the first transistor;

a second resistor, in series connection with the fourth transistor, that provides the voltage corresponding to the temperature in conjunction with the fourth transistor; and a fifth transistor coupled to the power supply and having a gate coupled to the gate of the third transistor and to the gate of the fourth transistor, the third transistor and the fifth transistor dividing a current flowing from the power supply into a first current and a second current, the first current flowing through the third transistor, the first transistor, and the first resistor, and the second current flowing through the fifth transistor and the second transistor.

2. The circuit as claimed in claim 1, wherein the temperature controller comprises:

a temperature sensor that measures the temperature of the semiconductor chip to provide a voltage corresponding to the temperature;

a reference generator responsive to a digital input to provide a reference voltage; and a control circuit, coupled to the temperature sensor and the reference generator, that inactivates the first heating element if the voltage corresponding to the temperature is greater than the reference voltage.

3. The circuit as claimed in claim 2, wherein the control circuit comprises:

a comparator, coupled to the temperature sensor and the reference generator, that compares the voltage with the reference voltage to generate a comparator output; and a first buffer, coupled between the comparator and the first heating element, that is responsive to the comparator output to perform one of
 activating the first heating element, and
 inactivating the first heating element.

4. The circuit as claimed in claim 3, wherein the comparator comprises a Schmitt trigger.

5. The circuit as claimed in claim 3, wherein the control circuit further comprises
a first gate, coupled between the comparator and the first buffer, the first gate and the first buffer inactivating the first heating element when the semiconductor chip is in a non-testing mode.

6. The circuit as claimed in claim 5 and further comprising
a second heating element, built into the semiconductor chip, that generates heat to increase the temperature of the semiconductor chip.

7. The circuit as claimed in claim 6, wherein the control circuit further comprises:

a second buffer, coupled between the comparator and the second heating element, that is responsive to the comparator output to perform one of
 activating the second heating element, and
 inactivating the second heating element; and a second gate, coupled between the comparator and the second buffer, the second gate and the second buffer inactivating the second heating element when the semiconductor chip is in the non-testing mode.

8. The circuit as claimed in claim 6, wherein the first heating element and the second heating element is one of a negative metal oxide semiconductor (NMOS) type transistor, a positive metal oxide semiconductor (PMOS) type transistor, and a resistor.

9. The circuit as claimed in claim 1, wherein
the first transistor and the second transistor are negative type bipolar junction transistors; and
the third transistor, the fourth transistor, and the fifth transistor are positive metal oxide semiconductor (PMOS) type transistors.

10. A circuit for enabling testing of a semiconductor chip at a desired temperature, the circuit comprising:

a first heating element, built into the semiconductor chip, that generates heat to increase temperature of the semiconductor chip;

a temperature sensor, built into the semiconductor chip, that measures the temperature of the semiconductor chip to provide a voltage corresponding to the temperature;

a reference generator built into the semiconductor chip and responsive to an input temperature to provide a reference voltage;

a comparator, built into the semiconductor chip, coupled to the temperature sensor and the reference generator, that compares the voltage corresponding to the temperature with the reference voltage to generate a comparator output;

a first buffer, coupled between the comparator and the first heating element, that is responsive to the comparator output to perform one of
 activating the first heating element, and
 inactivating the first heating element;

a first gate, coupled between the comparator and the first buffer, the first gate and the first buffer inactivating the first heating element when the semiconductor chip is in a non-testing mode;

a second heating element, built into the semiconductor chip, that generates heat to increase the temperature of the semiconductor chip;

a second buffer, coupled between the comparator and the second heating element, that is responsive to the comparator output to perform one of
 activating the second heating element, and
 inactivating the second heating element; and a second gate, coupled between the comparator and the second buffer, the second gate and the second buffer inactivating the second heating element when the semiconductor chip is in the non-testing mode.

11. The circuit as claimed in claim 10, wherein the first heating element and the second heating element are one of a negative metal oxide semiconductor (NMOS) type transistor, a positive metal oxide semiconductor (PMOS) type transistor, and a resistor.

* * * * *